(12) United States Patent
Sun

(10) Patent No.: US 9,722,214 B2
(45) Date of Patent: Aug. 1, 2017

(54) OLED PANEL, METHOD FOR FABRICATING THE SAME, SCREEN PRINTING PLATE, DISPLAY DEVICE

(71) Applicant: Boe Technology Group Co., Ltd., Beijing (CN)

(72) Inventor: Liang Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/784,640

(22) PCT Filed: Oct. 15, 2015

(86) PCT No.: PCT/CN2015/073737
§ 371 (c)(1),
(2) Date: Oct. 15, 2015

(87) PCT Pub. No.: WO2016/074381
PCT Pub. Date: May 19, 2016

(65) Prior Publication Data
US 2016/0329528 A1    Nov. 10, 2016

(30) Foreign Application Priority Data

Nov. 10, 2014  (CN) .......................... 2014 1 0645166

(51) Int. Cl.
*H01L 51/56*     (2006.01)
*B41F 15/02*     (2006.01)
(Continued)

(52) U.S. Cl.
CPC .............. *H01L 51/56* (2013.01); *B41F 15/02* (2013.01); *B41F 15/36* (2013.01); *H01L 51/524* (2013.01)

(58) Field of Classification Search
CPC ......... H01L 51/56; H01L 51/524; B41F 15/02
See application file for complete search history.

(56) References Cited

U.S. PATENT DOCUMENTS

2011/0186869 A1    8/2011  Hong
2011/0253709 A1*  10/2011  Kang .................. H01L 27/3251
                                                           220/2.1 R
2013/0256723 A1   10/2013  Jin et al.

FOREIGN PATENT DOCUMENTS

CN          1459996         12/2003
CN          1819728          8/2006
(Continued)

OTHER PUBLICATIONS

Office action from Chinese Application No. 201410645168.9 dated Apr. 28, 2016.

(Continued)

*Primary Examiner* — Kyoung Lee
(74) *Attorney, Agent, or Firm* — Calfee, Halter & Grisworld LLP

(57) ABSTRACT

The present invention provides an OLED panel and a method for fabricating the same, a screen printing plate, and a display device. The method comprises: forming an OLED mother board, wherein supporting adhesive is formed between an upper base plate and a lower base plate of the OLED mother board, and said supporting adhesive is located below a cutting line; and cutting said OLED mother board along said cutting line to obtain OLED panels. In the fabricating method of the present invention, when the OLED mother board is cut by a cutter wheel, the upper and lower base plate of the OLED mother board is subject to small deformation due to support of the supporting adhesive. As a result, travelling accuracy of the cutter wheel is improved, the distance between the cutting line and packaging adhesive is greatly reduced, and the frame width of the fabricated OLED panel is far less than that of an OLED panel fabricated by a conventional method.

7 Claims, 2 Drawing Sheets

(51) Int. Cl.
  *H01L 51/52* (2006.01)
  *B41F 15/36* (2006.01)

(56) References Cited

FOREIGN PATENT DOCUMENTS

| CN | 101198201 | 6/2008 |
| CN | 101363987 | 2/2009 |
| CN | 202443223 | 9/2012 |
| CN | 102844703 | 12/2012 |
| CN | 203589037 | 5/2014 |

OTHER PUBLICATIONS

International Search Report and Written Opinion from PCT/CN15/73737 dated Jul. 20, 2015.
Office action from Chinese Application No. 201410645166.9 dated Aug. 11, 2016.
Office Action from China Application No. 201410645166.9 dated Jan. 20, 2017.

* cited by examiner

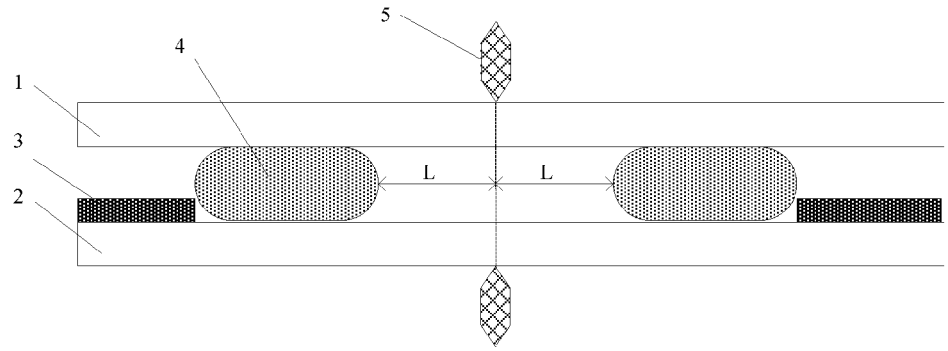
Fig. 1
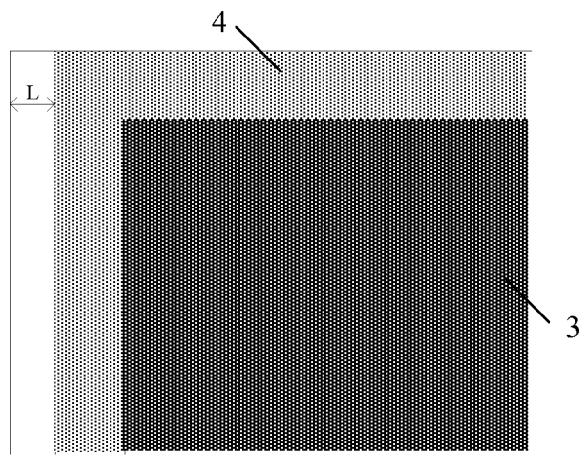
Fig. 2
| forming an OLED mother board, wherein supporting adhesive is formed between an upper base plate and a lower base plate of the OLED mother board, and said supporting adhesive is located below a cutting line | 301 |
| --- | --- |
↓
| cutting said OLED mother board along said cutting line to obtain OLED panels | 302 |
| --- | --- |
Fig. 3

OLED PANEL, METHOD FOR FABRICATING THE SAME, SCREEN PRINTING PLATE, DISPLAY DEVICE

RELATED APPLICATIONS

The present application is the U.S. national phase entry of PCT/CN2015/073737, with an international filing date of Mar. 6, 2015, which claims the benefit of Chinese Patent Application No. 201410645166.9, filed Nov. 10, 2014, the entire disclosures of which are incorporated herein by reference.

FIELD OF THE INVENTION

The present invention relates to the field of display technology, and particularly to an OLED panel, a method for fabricating the same, a screen printing plate, and a display device.

BACKGROUND ART

During fabricating an OLED (Light-Emitting Diode) panel, an OLED mother board (comprising a display area, driving circuits, glass packaging adhesive, glass base plate or the like) with a complete layer structure is generally formed, and then the OLED mother board is cut to obtain each OLED panel. FIG. 1 shows a case of cutting an OLED mother board in the prior art. The OLED mother board comprises an upper base plate (a package base plate) 1, a lower base plate (back plate) 2, a display area 3 between the upper and lower base plate, and packaging adhesive 4. A hollow area with a length of 2L exits between packaging adhesive 4 of two OLED panels. Cutting with a cutter wheel 5 is performed on the hollow area between packaging adhesive of two OLED panels. An OLED panel obtained by this cutting is shown in FIG. 2. The packaging adhesive 4 as well as a region (with a width of L) between the cutting line and the packaging adhesive 4 form a frame area of the OLED panel. When the OLED mother board is cut by the cutter wheel 5, the pressure which is imposed on the OLED mother board by the cutter wheel leads to deformation of the upper and lower base plate of the OLED mother board. This deformation will reduce travelling accuracy of the cutter wheel 5. In this case, in order to avoid cutting the packaging adhesive 4, it is required that the hollow area is wide enough, which is non favorable for reducing the frame width of the OLED panel.

SUMMARY

It is an object of the present invention to provide a method for reducing frame width of an OLED panel.

To this end, the present invention provides a method for fabricating an OLED mother board, comprising steps of:

forming an OLED mother board, wherein supporting adhesive is formed between an upper base plate and a lower base plate of the OLED mother board, and the supporting adhesive is located below a cutting line;

cutting the OLED mother board along the cutting line to obtain OLED panels.

Further, the step of forming the OLED mother board comprises:

printing the supporting adhesive below the cutting line in the same process as printing the packaging adhesive.

Further, a gap with a preset distance lies between the packaging adhesive and the supporting adhesive.

Further, the supporting adhesive is made from glass frit.

The present invention provides a screen printing plate comprising a first pattern region which is adapted to print packaging adhesive onto a marginal region of each OLED panel on an OLED mother board. The screen printing plate further comprises a second pattern region which is adapted to print supporting adhesive below a cutting line.

Further, a gap with a preset distance lies between the first pattern region and the second pattern region.

Further, a region in the first and/or second pattern region which corresponds to an edge of packaging adhesive or supporting adhesive has an aperture ratio larger than that of other regions in the first and/or second pattern region.

The present invention further provides an OLED panel, comprising supporting adhesive which lies between an upper base plate and a lower base plate and outside packaging adhesive of the OLED panel, and an outer side of the supporting adhesive is flush with sides of the upper and lower base plate.

Further, the distance between an outer side of the packaging adhesive and sides of the upper and lower base plate is smaller than the distance between the outer side of packaging adhesive and edges of the upper and lower base plate in an OLED panel without supporting adhesive.

The present invention further provides an OLED display device, comprising the above-mentioned OLED panel.

In the method for fabricating an OLED panel of the present invention, supporting adhesive is formed below a cutting line before the OLED mother board is cut. In this way, when the OLED mother board is cut by a cutter wheel, the upper and lower base plate of the OLED mother board is subject to small deformation due to support of the supporting adhesive. As a result, travelling accuracy of the cutter wheel is improved, the distance between the cutting line and packaging adhesive is greatly reduced, and the frame width of the fabricated OLED panel is far less than that of an OLED panel fabricated by a conventional method.

BRIEF DESCRIPTION OF DRAWINGS

FIG. 1 is a schematic view for illustrating cutting of an OLED mother board in a method for fabricating the OLED panel in the prior art;

FIG. 2 is a structural view for illustrating a partial region of the OLED panel fabricated by the method for fabricating the OLED panel in the prior art;

FIG. 3 is a flow chart for illustrating a method for fabricating an OLED panel of the present invention;

DETAILED DESCRIPTION OF EMBODIMENTS

The present disclosure will be elucidated hereinafter in details with reference to the accompanying drawings and embodiments. Apparently, these embodiments only constitute some embodiments of the present disclosure. The scope of the present disclosure is by no means limited to embodiments as set forth herein.

The present invention provides a method for fabricating an OLED panel. As shown in FIG. 3, the method comprises the following steps.

In step 301, an OLED mother board is formed, supporting adhesive is formed between an upper base plate and a lower base plate of the OLED mother board, and the supporting adhesive is located below a cutting line.

In implementations, glass frit can be deposited on a position of the lower base plate which corresponds to the cutting line by a method like screen printing. After the upper and lower base plate are assembled, glass frit is radiated by laser to cure, resulting in an OLED mother board in which supporting adhesive is formed below the cutting line. In practical applications, the above step 301 can of course be realized in other manners, and other materials can also be deposited as the supporting adhesive. All technical solutions which can realize the same effects fall within the protection scope of the present invention.

In step 302, the OLED mother board is cut along the cutting line to obtain OLED panels.

Figure 4:
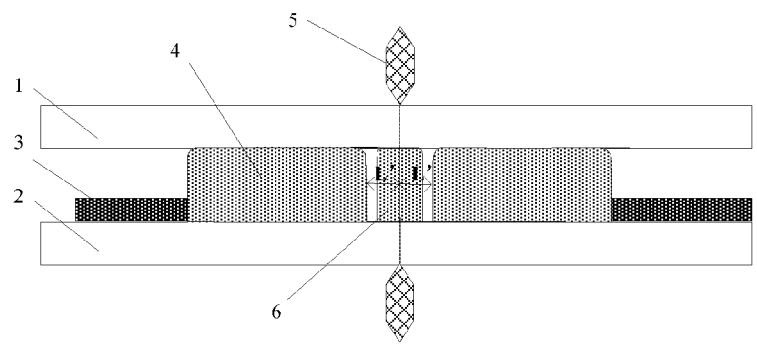
FIG. 4 is a schematic view for illustrating cutting of the OLED mother board in the method for fabricating the OLED panel of the present invention.
Figure 5:
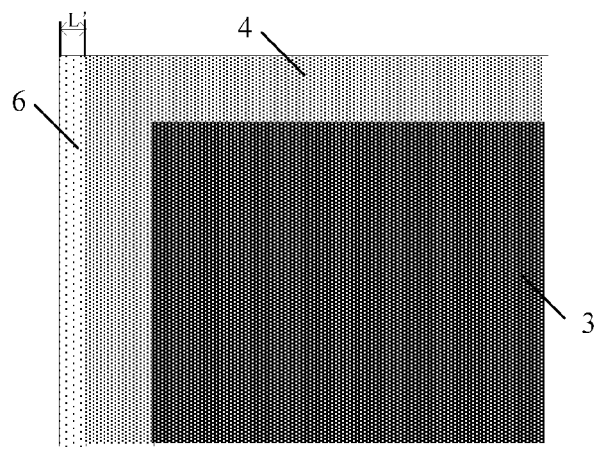
FIG. 5 is a structural view for illustrating a region of the OLED panel fabricated by the method for fabricating the OLED panel of the present invention.

The technical effects of the method of the present invention will be described hereinafter by referring to FIG. 4 and FIG. 5. FIG. 4 is a schematic view for illustrating a case in which the OLED mother board obtained from step 301 is cut in step 302. At this time, the cutter wheel 5 is located right above or right below the supporting adhesive 6. Thus, since the supporting adhesive functions to support the base plates during cutting, the base plates are subject to relatively small deformation, making it possible to prevent minute cracks which otherwise would develop when the base plates break due to deformation. Besides, since the base plates are subject to small deformation, travelling accuracy of the cutter wheel 5 can be improved significantly. Thus, the distance L' between the packaging adhesive 4 and the cutting line can be greatly reduced. As shown in FIG. 5, the OLED panel fabricated by the method of the present invention has a relatively small frame width.

Further, the supporting adhesive can be printed below the cutting line in the same process as printing the packaging adhesive.

In this way, there is no need to add a process for printing supporting adhesive, thus reducing complexity for fabricating supporting adhesive.

Further, as shown in FIG. 4, a gap with a preset distance lies between the packaging adhesive and the supporting adhesive.

In implementations, the magnitude of the preset distance can be set by a skilled in the art as required. In this way, it is possible to prevent cracks which develop in supporting adhesive during cutting supporting adhesive from extending to packaging adhesive. Of course, in case effects on packaging adhesive are not considered, the packaging adhesive and the supporting adhesive can be connected with each other, i.e., the packaging adhesive and the supporting adhesive are formed into an integral part. The corresponding solutions can also overcome the problem that the base plates are subject to large deformation. Preferred embodiments of the present invention can not be deemed as limitations to the protection scope of the present invention.

Further, the supporting adhesive is made from glass frit.

In case the supporting adhesive pattern is made from glass frit, strength for supporting the base plates can be increased, which can better prevent the base plates from deforming. Besides, since the packaging adhesive generally is also made from glass frit, the packaging adhesive and the support adhesive can be formed in the same process by glass frit, which further reduces the fabrication complexity.

Figure 6:
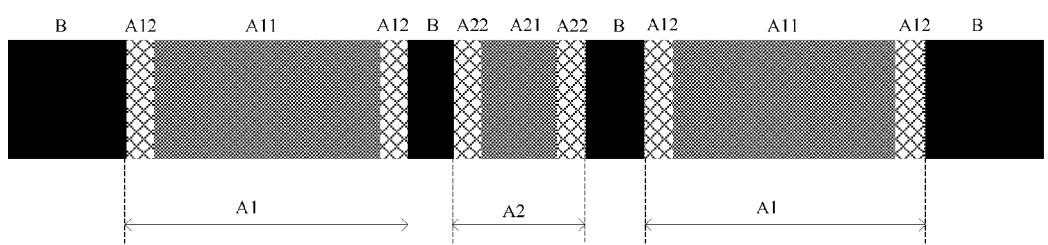
FIG. 6 is a structural view for illustrating a screen printing plate of the present invention.

The present invention further provides a screen printing plate. As shown in FIG. 6, the screen printing plate comprises a first pattern region A1, a second pattern region A2, and a non-pattern region B. The term "pattern region" in this context refers to a region with openings through which printing ink can be deposited onto the lower base plate. Accordingly, the non-pattern region B refers to a region without openings. A preset gap lies between the first pattern region A1 and the second pattern region A2, and there is also no opening the gap. Namely, the region between the first pattern region A1 and the second pattern region A2 is the non-pattern region B.

The first pattern region A1 is used for printing the packaging adhesive, and the second pattern region A2 is used for printing the supporting adhesive. The supporting adhesive printed by means of the second pattern region A2 lies below the cutting line of the fabricated OLED mother board.

By means of the screen printing plate of the present invention, it is possible to print the supporting adhesive below the cutting line at the same time for printing the packaging adhesive. In this manner, minute cracks will not easily develop in the OLED mother board during cutting, and the frame width of the fabricated OLED panel can be reduced. In addition, it is possible to prevent minute cracks which develop in the supporting adhesive during cutting the supporting adhesive from spreading to the packaging adhesive.

Preferably, each A1 region comprises a region A11 and regions A12. The regions A12 are located at both sides of the region A11 and form marginal regions of the corresponding packaging adhesive. The regions A12 have an aperture ratio larger than that of the region A11.

Preferably, each A2 region comprises a region A21 and regions A22. The regions A22 are located at both sides of the region A21 and form marginal regions of the corresponding packaging adhesive. The regions A22 have an aperture ratio larger than that of the region A21.

In this way, more glass frit can be deposited on edges of the packaging adhesive or supporting adhesive, so that the fabricated packaging adhesive or supporting adhesive has a cross section more close to a rectangle (see FIG. 5). Accordingly, the contact area between the packaging adhesive or supporting adhesive and the upper and lower base plate is increased, enabling better sealing or support effect. In practice, each pattern region can have the same aperture ratio, and of course this can also achieve effects of reducing deformation of the base plates and preventing minute cracks in supporting adhesive from spreading to packaging adhesive. The corresponding technical solutions also fall within the protection scope of the present invention.

It is noted that FIG. 6 shows a case in which a preset gap lies between the first pattern region A1 and the second pattern region A2. However, in practical applications, the first pattern region A1 can also be connected with the second pattern region A2, so that the complexity for fabricating the screen printing plate can be reduced. Yet in this case, minute cracks which develop in the supporting adhesive during cutting the supporting adhesive may spread to the packaging adhesive.

The present invention further provides an OLED panel, which can have a structure shown in FIG. 5. The OLED panel comprises supporting adhesive 6 which lies outside packaging adhesive of the OLED panel and between the upper and lower base plate. An outer side of the supporting adhesive 6 is flush with sides of the upper and lower base plate.

Preferably, the distance between an outer side of the packaging adhesive and sides of the upper and lower base plate is smaller than the distance between the outer side of the packaging adhesive and edges of the upper and lower base plate in an OLED panel without supporting adhesive.

The present invention further provides an OLED display device which comprises the above-mentioned OLED panel.

Herein, the display device can be any product or component with a display function like electronic paper, mobile phone, tablet computer, TV, monitor, notebook computer, digital photo frame, and navigator.

Although the present invention has been described above with reference to specific embodiments, it should be understood that the limitations of the described embodiments are merely for illustrative purpose and by no means limiting. Instead, the scope of the invention is defined by the appended claims rather than by the description, and all variations that fall within the range of the claims are intended to be embraced therein. Thus, other embodiments than the specific ones described above are equally possible within the scope of these appended claims.

The invention claimed is:

1. A method for fabricating an OLED panel, comprising the steps of:
    forming an OLED mother board, wherein a packaging adhesive and a supporting adhesive are formed between an upper base plate and a lower base plate of the OLED mother board, said packaging adhesive is arranged around a display area for sealing the upper base plate and the lower base plate, said supporting adhesive is located below a cutting line, and said packaging adhesive and said supporting adhesive are formed in a same process by printing; and
    cutting said OLED mother board along said cutting line to obtain OLED panels.

2. The method of claim 1, wherein a gap with a preset distance lies between said packaging adhesive and said supporting adhesive.

3. The method of claim 1, wherein said supporting adhesive is made from glass frit.

4. The method of claim 1, wherein said packaging adhesive and said supporting adhesive are connected with each other.

5. A screen printing plate comprising:
    a first pattern region which is adapted to print a packaging adhesive onto a marginal region of each OLED panel on an OLED mother board; and
    a second pattern region which is adapted to print a supporting adhesive below a cutting line,
    wherein a gap with a preset distance lies between said first pattern region and said second pattern region;
    wherein a region in said first pattern region which corresponds to an edge of said packaging adhesive has an aperture ratio larger than that of other regions in said first pattern region.

6. The screen printing plate of claim 5, wherein said first pattern region and said second pattern region are connected with each other.

7. A screen printing plate comprising:
    a first pattern region which is adapted to print a packaging adhesive onto a marginal region of each OLED panel on an OLED mother board; and
    a second pattern region which is adapted to print a supporting adhesive below a cutting line,
    wherein a gap with a preset distance lies between said first pattern region and said second pattern region;
    wherein a region in said second pattern region which corresponds to an edge of said supporting adhesive has an aperture ratio larger than that of other regions in said second pattern region.

* * * * *